US009432771B2

(12) United States Patent
Oyetunji

(10) Patent No.: US 9,432,771 B2
(45) Date of Patent: Aug. 30, 2016

(54) SYSTEMS AND METHODS FOR PROTECTING A SPEAKER FROM OVEREXCURSION

(71) Applicant: Cirrus Logic, Inc., Austin, TX (US)

(72) Inventor: Samuel Oyetunji, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 237 days.

(21) Appl. No.: 14/032,586

(22) Filed: Sep. 20, 2013

(65) Prior Publication Data

US 2015/0086025 A1 Mar. 26, 2015

(51) Int. Cl.

| | |
|---|---|
| ***H03G 11/00*** | (2006.01) |
| ***H04R 3/00*** | (2006.01) |
| *H04R 29/00* | (2006.01) |

(52) U.S. Cl.

CPC ............ *H04R 3/007* (2013.01); *H04R 29/003* (2013.01)

(58) Field of Classification Search

CPC ...... H04R 5/02; H04R 29/001; H04R 3/007; H04R 27/00; H04R 1/227; H04R 3/002; H04R 3/00; H04R 3/005; H04R 19/04; H04R 1/406; H04R 9/08; H04R 19/02; H04R 17/00; H04R 2217/01; H04R 2499/15; H04R 3/04; H04R 1/2888; H04R 2499/11; H04R 29/003; H04R 9/022; H04R 1/00; H04R 2209/022; H04R 7/18; H04R 9/02; H04R 9/025; H04R 3/02

USPC ................ 381/300, 59, 55, 85, 89, 332, 96, 381/111–117

See application file for complete search history.

(56) References Cited

U.S. PATENT DOCUMENTS

| | | | |
|---|---|---|---|
| 2005/0031117 | A1 | 2/2005 | Browning et al. |
| 2005/0031131 | A1 | 2/2005 | Browning et al. |

(Continued)

FOREIGN PATENT DOCUMENTS

| | | | |
|---|---|---|---|
| EP | 1513372 | A2 | 3/2005 |
| EP | 2453669 | A1 | 5/2012 |
| EP | 2456229 | A1 | 5/2012 |

OTHER PUBLICATIONS

Franken, Dietrich, et al., "Passive Parametric Modeling of Dynamic Loudspeakers", IEEE Transactions on Speech and Audio Processing, New York, NY, vol. 9, No. 8, Nov. 1, 2001, pp. 885-891.

(Continued)

*Primary Examiner* — Akelaw Teshale
(74) *Attorney, Agent, or Firm* — Jackson Walker L.L.P.

(57) ABSTRACT

In accordance with embodiments of the present disclosure, a system may include a controller configured to be coupled to an audio speaker. The controller may be configured to receive an audio input signal. The controller may also be configured to, based on a linear displacement transfer function associated with the audio speaker, process the audio input signal to generate a modeled linear displacement of the audio speaker, wherein the linear displacement transfer function has a response that models linear displacement of the audio speaker as a linear function of the audio input signal. The controller may further be configured to, based on an excursion linearity function associated with the audio speaker, process the modeled linear displacement to generate a predicted actual displacement of the audio speaker, wherein the excursion linearity function is a function of the modeled linear displacement and has a response modeling non-linearities of the displacement of the audio speaker as a function of the audio input signal.

18 Claims, 2 Drawing Sheets

(56) References Cited

U.S. PATENT DOCUMENTS

| | | | | |
|---|---|---|---|---|
| 2005/0031132 | A1 | 2/2005 | Browning et al. | |
| 2005/0031133 | A1 | 2/2005 | Browning et al. | |
| 2005/0031134 | A1 | 2/2005 | Leske | |
| 2005/0031137 | A1 | 2/2005 | Browning et al. | |
| 2005/0031138 | A1 | 2/2005 | Browning et al. | |
| 2005/0031139 | A1 | 2/2005 | Browning et al. | |
| 2005/0031140 | A1 | 2/2005 | Browning | |
| 2006/0104451 | A1 | 5/2006 | Browning et al. | |
| 2009/0268918 | A1* | 10/2009 | Solgaard ................ | H03G 9/025 381/55 |
| 2012/0121098 | A1* | 5/2012 | Gautama ................ | H04R 3/007 381/59 |
| 2012/0179456 | A1* | 7/2012 | Ryu ........................ | H04R 3/007 704/200.1 |
| 2014/0254804 | A1* | 9/2014 | Su .......................... | H04R 3/007 381/55 |

OTHER PUBLICATIONS

Klippel, Wolfgang, "Active Compensation of Transducer Nonlinearities", AES 23rd International Conference, May 23, 2003, pp. 1-17.

Bright, Andrew, Active Control of Loudspeakers: an Investigation of Practical Applications, Orsted-DTU, Acoustic Technology, Technical University of Denmark, Building 352, DK-2800 Kgs. Lyngby, Denmark, 2002.

Klippel, Wolfgang, Modeling the Large Signal Behavior of Micro-speakers, Institute of Acoustics and Speech Communication, Dresden University of Technology, 133rd AES Convention 2012.

* cited by examiner

SYSTEMS AND METHODS FOR PROTECTING A SPEAKER FROM OVEREXCURSION

FIELD OF DISCLOSURE

The present disclosure relates in general to audio speakers, and more particularly, to modeling displacement of a speaker system in order to protect audio speakers from damage.

BACKGROUND

Audio speakers or loudspeakers are ubiquitous on many devices used by individuals, including televisions, stereo systems, computers, smart phones, and many other consumer devices. Generally speaking, an audio speaker is an electroacoustic transducer that produces sound in response to an electrical audio signal input.

Given its nature as a mechanical device, an audio speaker may be subject to damage caused by operation of the speaker, including overheating and/or overexcursion, in which physical components of the speaker are displaced too far a distance from a resting position. To prevent such damage from happening, speaker systems often include control systems capable of controlling audio gain, audio bandwidth, and/or other components of an audio signal to be communicated to an audio speaker.

However, existing approaches to speaker system control have disadvantages. For example, many such approaches model speaker operation based on measured operating characteristics, but employ linear models. Such linear models may adequately model small signal behavior, but may not sufficiently model nonlinear effects to a speaker caused by larger signals. As another example, some existing approaches model nonlinear behavior, but such models are often mathematically complex, often requiring additional design complexity, cost, and processing resources.

SUMMARY

In accordance with the teachings of the present disclosure, certain disadvantages and problems associated with protecting a speaker from damage have been reduced or eliminated.

In accordance with embodiments of the present disclosure, a system may include a controller configured to be coupled to an audio speaker. The controller may be configured to receive an audio input signal. The controller may also be configured to, based on a linear displacement transfer function associated with the audio speaker, process the audio input signal to generate a modeled linear displacement of the audio speaker, wherein the linear displacement transfer function has a response that models linear displacement of the audio speaker as a linear function of the audio input signal. The controller may further be configured to, based on an excursion linearity function associated with the audio speaker, process the modeled linear displacement to generate a predicted actual displacement of the audio speaker, wherein the excursion linearity function is a function of the modeled linear displacement and has a response modeling non-linearities of the displacement of the audio speaker as a function of the audio input signal.

In accordance with these and other embodiments of the present disclosure, a method may include receiving an audio input signal. The method may also include, based on a linear displacement transfer function associated with the audio speaker, processing the audio input signal to generate a modeled linear displacement of the audio speaker, wherein the linear displacement transfer function has a response that models linear displacement of the audio speaker as a linear function of the audio input signal. The method may further include, based on an excursion linearity function associated with the audio speaker, processing the modeled linear displacement to generate a predicted actual displacement of the audio speaker, wherein the excursion linearity function is a function of the modeled linear displacement and has a response modeling non-linearities of the displacement of the audio speaker as a function of the audio input signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
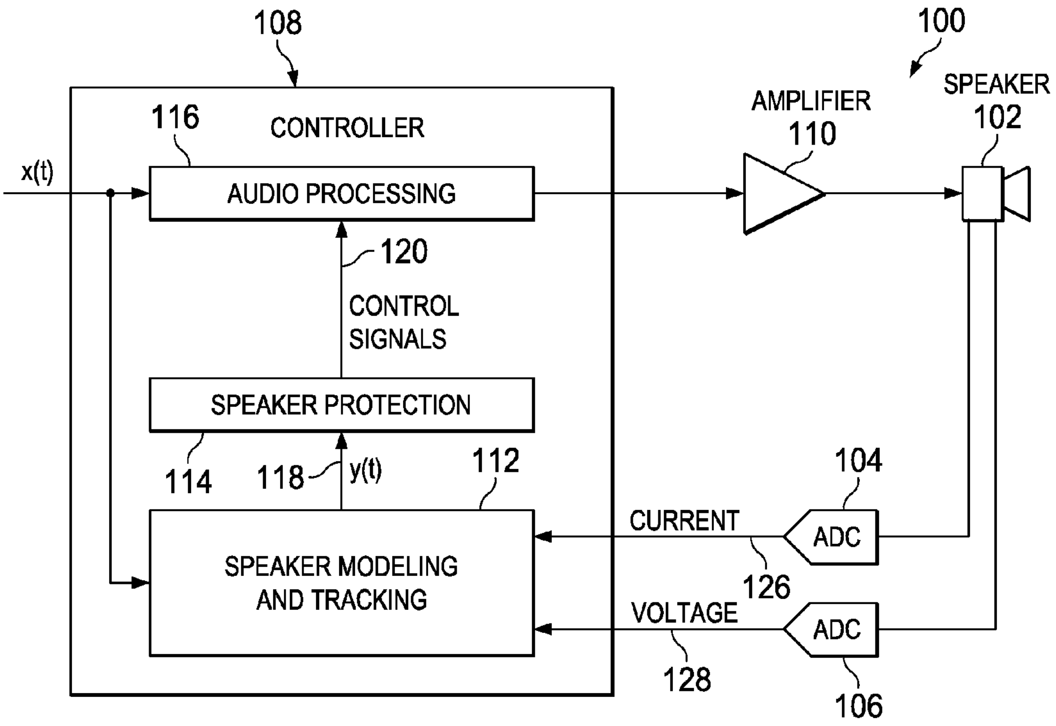
FIG. 1 illustrates a block diagram of an example system that uses speaker modeling and tracking to control operation of an audio speaker, in accordance with embodiments of the present disclosure.

FIG. 1 illustrates a block diagram of an example system 100 that employs a controller 108 to control the operation of an audio speaker 102, in accordance with embodiments of the present disclosure. Audio speaker 102 may comprise any suitable electroacoustic transducer that produces sound in response to an electrical audio signal input (e.g., a voltage or current signal). As shown in FIG. 1, controller 108 may generate such an electrical audio signal input, which may be further amplified by an amplifier 110. In some embodiments, one or more components of system 100 may be integral to a single integrated circuit (IC).

Controller 108 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 108 may interpret and/or execute program instructions and/or process data stored in a memory (not explicitly shown) communicatively coupled to controller 108. As shown in FIG. 1, controller 108 may be configured to perform speaker modeling and tracking 112, speaker protection 114, and/or audio processing 116, as described in greater detail below.

Amplifier 110 may be any system, device, or apparatus configured to amplify a signal received from controller 108 and communicate the amplified signal (e.g., to speaker 102). In some embodiments, amplifier 110 may comprise a digital amplifier configured to also convert a digital signal output from controller 108 into an analog signal to be communicated to speaker 102.

The audio signal communicated to speaker 102 may be sampled by each of an analog-to-digital converter 104 and an analog-to-digital converter 106, configured to respectively detect an analog current and an analog voltage associated with the audio signal, and convert such analog current and analog voltage measurements into digital signals 126 and 128 to be processed by controller 108. Based on digital current signal 126, digital voltage signal 128, and an audio input signal x(t), controller 108 may perform speaker modeling and tracking 112 in order to generate a modeled response 118, including a predicted displacement y(t) for speaker 102, as described in greater detail below. In some embodiments, speaker modeling and tracking 112 may provide a recursive, adaptive system to generate such modeled response 118. Example embodiments of speaker modeling and tracking 112 are discussed in greater detail below with reference to FIG. 2.

Controller 108 may perform speaker protection 114 based on one or more operating characteristics of the audio speaker, including without limitation modeled response 118. For example, speaker protection 114 may compare modeled response 118 (e.g., a predicted displacement y(t)) to one or more corresponding speaker protection thresholds (e.g., a speaker protection threshold displacement), and based on such comparison, generate one or more control signals for communication to audio processing 116. Thus, by comparing a predicted displacement y(t) (as included within modeled response 118) to an associated speaker protection threshold displacement, speaker protection 114 may generate control signals for modifying one or more characteristics of audio input signal x(t) (e.g., amplitude, frequency, bandwidth, phase, etc.) while providing a psychoacoustically pleasing sound output (e.g., control of a virtual bass parameter).

Based on the one or more control signals 120, controller 108 may perform audio processing 116, whereby it applies the various control signals 120 to process audio input signal x(t) and generate an electrical audio signal input as a function of audio input signal x(t) and the various speaker protection control signals, which controller 108 communicates to amplifier 110.

Figure 2:
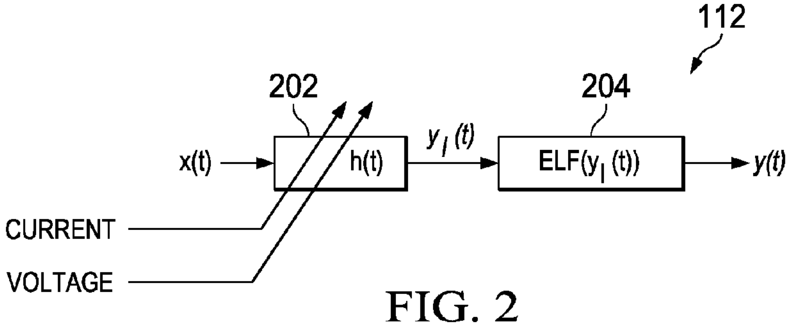
FIG. 2 illustrates a model for modeling and tracking displacement of an audio speaker, in accordance with embodiments of the present disclosure.

FIG. 2 illustrates a more detailed block diagram of a system for performing modeling and tracking 112 shown in FIG. 1, in accordance with embodiments of the present disclosure. Speaker modeling and tracking 112 may be used to generate modeled response 118 (e.g., predicted displacement y(t)) based on measured characteristics of speaker 102 (e.g., as indicated by digital current signal 126 and digital voltage signal 128, respectively), and/or audio input signal x(t). In some embodiments, speaker modeling and tracking 112 may provide a recursive, adaptive system to generate such modeled response 118. As shown in FIG. 2, speaker modeling and tracking 112 may include an adaptive filter 202 with a response h(t) and a nonlinear filter 204 with a response $ELF(y_l(t))$. Response h(t) of filter 202 is a linear displacement transfer function associated with audio speaker 102 that models linear displacement $y_l(t)$ of the audio speaker as a linear function of audio input signal x(t).

In some embodiments, linear displacement transfer function h(t) correlates an amplitude and a frequency of audio input signal x(t) to an expected displacement of audio speaker 102 in response to the amplitude and the frequency of audio input signal h(t).

Figure 3:
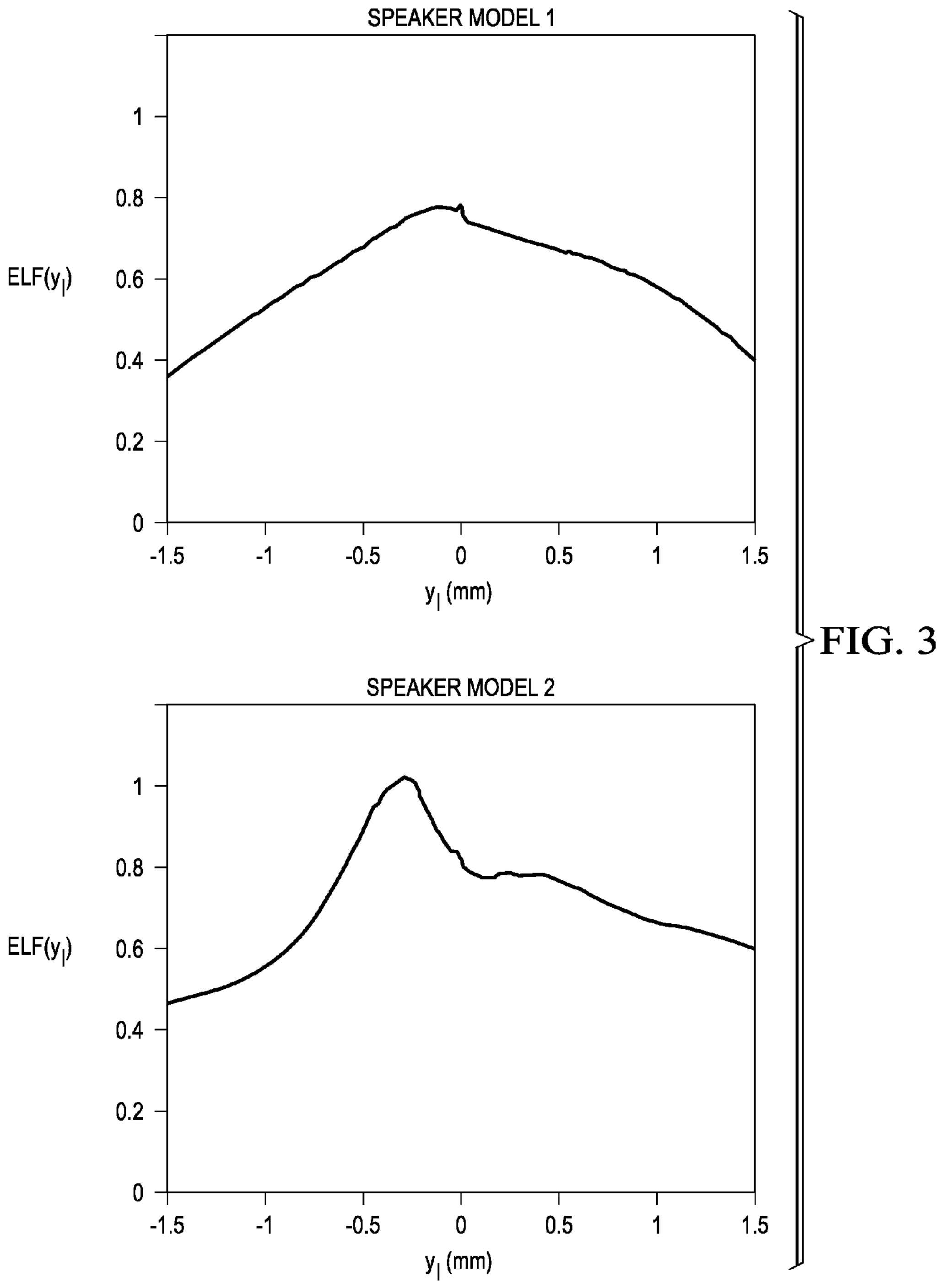
FIG. 3 illustrates graphs depicting example responses of excursion linearity factors for two different models of audio speakers, in accordance with embodiments of the present disclosure.

Response $ELF(y_l(t))$ is an excursion linearity function that is a function of the modeled linear displacement $y_l(t)$ and models non-linearities of the displacement of audio speaker 102 as a function of the audio input signal. Response $ELF(y_l(t))$ may combine non-linearities (e.g., force factor, stiffness) of audio speaker 102 into a single scaling factor which is a function of modeled linear displacement $y_l(t)$. Accordingly, responsive to a linear displacement $y_l(t)$, filter 204 generates a predicted actual displacement y(t). An example of response $ELF(y_l(t))$ for two different models of audio speakers is shown in FIG. 3.

In some embodiments, excursion linearity function $ELF(y_l(t))$ may be characterized using offline testing of one or more audio speakers similar to the audio speaker. For example, in such embodiments, excursion linearity function $ELF(y_l(t))$ may be determined by comparing the modeled linear displacement $y_l(t)$ in response to a particular audio input signal (e.g., a pink noise signal) and a measured displacement of audio speaker 102 (or one or more audio speakers similar or identical in design and/or functionality with audio speaker 102) in response to the particular audio input signal, and statistically minimizing an error between the modeled linear displacement $y_l(t)$ and the measured displacement. This comparison and statistical minimization of area may be repeated at various amplitudes of audio signal, so that response $ELF(y_l(t))$ may be determined for a full displacement range of audio speaker 102. In addition or alternatively, such testing may be applied to many audio speakers similar in identical in design to audio speaker 102 (e.g., the same model as audio speaker 102), such that response $ELF(y_l(t))$ is based on an average of similar or identical audio speakers. In some embodiments, excursion linearity function $ELF(y_l(t))$ may be independent of a frequency of the audio input signal.

In these and other embodiments, controller 108 may shape the response of the linear displacement transfer function h(t) in conformity with a measured characteristics of speaker 102 (e.g., as indicated by current signal 126 and/or voltage signal 128). Accordingly, speaker modeling and tracking 112 may provide a recursive, adaptive system which modifies the response of filter 202 based on comparison of actual measured values (e.g., current signal 126, voltage signal 128) that may be indicative of a physical state of audio speaker 102 (e.g., speaker temperature and surroundings) with predictive characteristics of audio speaker 102 (e.g., expected temperature and surroundings).

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising a controller configured to be coupled to an audio speaker, wherein the controller:

receives an audio input signal;

based on a linear displacement transfer function associated with the audio speaker, processes the audio input signal to generate a modeled linear displacement of the audio speaker, wherein the linear displacement transfer function has a response that models linear displacement of the audio speaker as a linear function of the audio input signal; and based on an excursion linearity function associated with the audio speaker, processes the modeled linear displacement to generate a predicted actual displacement of the audio speaker, wherein the excursion linearity function:

is a function of the modeled linear displacement; and has a response modeling non-linearities of the displacement of the audio speaker as a function of the audio input signal.

2. The system of claim 1, wherein the excursion linearity function is based on offline testing of one or more audio speakers similar to the audio speaker.

3. The system of claim 2, wherein the excursion linearity function is determined by statistically minimizing an error between the modeled linear displacement in response to a particular audio input signal and a measured displacement of the audio speaker in response to the particular audio input signal.

4. The system of claim 1, wherein the linear displacement transfer function correlates an amplitude and a frequency of the audio input signal to an expected displacement of the audio speaker in response to the amplitude and the frequency of the audio input signal.

5. The system of claim 1, wherein the excursion linearity function is independent of a frequency of the audio input signal.

6. The system of claim 1, wherein the controller shapes the response of the linear displacement transfer function in conformity with at least one of a current signal indicative of an electrical current associated with the audio speaker and a voltage signal indicative of an electrical voltage associated with the audio speaker.

7. The system of claim 1, wherein the controller processes the audio input signal to generate an audio output signal communicated from the controller to the audio speaker based on the predicted actual displacement.

8. The system of claim 7, wherein the controller compares the predicted actual displacement to a speaker protection threshold displacement, and based on the comparison, generates the audio output signal.

9. The system of claim 7, wherein the controller generates the audio output signal by applying at least one of a gain, a bandwidth, and a virtual bass to the audio input signal.

10. A method comprising:

receiving an audio input signal;

based on a linear displacement transfer function associated with the audio speaker, processing the audio input signal to generate a modeled linear displacement of the audio speaker, wherein the linear displacement transfer function has a response that models linear displacement of the audio speaker as a linear function of the audio input signal; and based on an excursion linearity function associated with the audio speaker, processing the modeled linear displacement to generate a predicted actual displacement of the audio speaker, wherein the excursion linearity function:

is a function of the modeled linear displacement; and has a response modeling non-linearities of the displacement of the audio speaker as a function of the audio input signal.

11. The method of claim 10, wherein the excursion linearity function is based on offline testing of one or more audio speakers similar to the audio speaker.

12. The method of claim 11, wherein the excursion linearity function is determined by statistically minimizing an error between the modeled linear displacement in response to a particular audio input signal and a measured displacement of the audio speaker in response to the particular audio input signal.

13. The method of claim 10, wherein the linear displacement transfer function correlates an amplitude and a frequency of the audio input signal to an expected displacement of the audio speaker in response to the amplitude and the frequency of the audio input signal.

14. The method of claim 10, wherein the excursion linearity function is independent of a frequency of the audio input signal.

15. The method of claim 10, further comprising shaping the response of the linear displacement transfer function in conformity with at least one of a current signal indicative of an electrical current associated with the audio speaker and a voltage signal indicative of an electrical voltage associated with the audio speaker.

16. The method of claim 10, further comprising processing the audio input signal to generate an audio output signal communicated from the controller to the audio speaker based on the predicted actual displacement.

17. The method of claim 16, further comprising comparing the predicted actual displacement to a speaker protection threshold displacement, and based on the comparison, generating the audio output signal.

18. The method of claim 16, further comprising generating the audio output signal by applying at least one of a gain, a bandwidth, and a virtual bass to the audio input signal.

* * * * *